(12) United States Patent
Schillinger et al.

(10) Patent No.: US 9,640,467 B2
(45) Date of Patent: May 2, 2017

(54) SENSOR ARRANGEMENT AND CHIP COMPRISING ADDITIONAL FIXING PINS

(75) Inventors: Jakob Schillinger, Gaimersheim (DE);
Stephan Risch, Weiterstadt (DE);
Dietmar Huber, Dietzenbach (DE);
Günther Romhart, Süßen (DE);
Andreas Döring, Wiesbaden (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 183 days.

(21) Appl. No.: 13/388,097

(22) PCT Filed: Aug. 5, 2010

(86) PCT No.: PCT/EP2010/061457
§ 371 (c)(1),
(2), (4) Date: Jan. 31, 2012

(87) PCT Pub. No.: WO2011/015642
PCT Pub. Date: Feb. 10, 2011

(65) Prior Publication Data
US 2012/0206888 A1 Aug. 16, 2012

(30) Foreign Application Priority Data
Aug. 5, 2009 (DE) .......................... 10 2009 036 133

(51) Int. Cl.
*H05K 1/00* (2006.01)
*H01L 23/495* (2006.01)
(Continued)

(52) U.S. Cl.
CPC ...... *H01L 23/49541* (2013.01); *G01D 11/245* (2013.01); *H01L 24/48* (2013.01);
(Continued)

(58) Field of Classification Search
CPC . H01L 2924/01079; H01L 2924/01014; H01L 2924/14; H01L 2924/15153;
(Continued)

(56) References Cited

U.S. PATENT DOCUMENTS 3,689,804 A * 9/1972 Ishihama et al. ............. 361/720
4,004,195 A * 1/1977 Harayda et al. ............. 361/710
(Continued)

FOREIGN PATENT DOCUMENTS

DE 29901093 U1 5/1999
DE 10136438 A1 3/2002
(Continued)

OTHER PUBLICATIONS

"Precision Amplifier for Bridge Circuits AM457", Analog Microelectronics (May 2005) XP-002609497, 10 pgs.
(Continued)

*Primary Examiner* — Courtney Smith
*Assistant Examiner* — Christopher L Augustin
(74) *Attorney, Agent, or Firm* — RatnerPrestia

(57) ABSTRACT

An electronic chip is disclosed, including at least one electronic circuit and two or more contact-making pins, wherein the chip additionally has at least one fixing pin. A sensor arrangement is also disclosed for detecting at least one physical or chemical variable relating to a carrier. The sensor arrangement has at least one sensor element which is directly or indirectly coupled to the carrier, and also has an electronic interface arrangement with at least one leadframe, at least one electronic circuit connected to the leadframe, and also at least one electrically insulating housing part which is embodied in such a way that it performs at least one of the functions of (i) at least partly enclosing the at least one electronic circuit, and (ii) mechanically supporting at least parts of the leadframe to one another.

18 Claims, 8 Drawing Sheets

(51) Int. Cl.
*G01D 11/24* (2006.01)
*H01L 23/00* (2006.01)

(52) U.S. Cl.
CPC .... *H01L 24/49* (2013.01); *H01L 2224/48137* (2013.01); *H01L 2224/48247* (2013.01); *H01L 2224/49171* (2013.01); *H01L 2924/00014* (2013.01); *H01L 2924/181* (2013.01)

(58) Field of Classification Search
CPC . H01L 2924/01005; H01L 2224/48247; H01L 2224/48091; H01L 2224/49171; H01L 2224/48; H01L 2224/45144; H01L 21/4842; H01L 24/45; H01L 24/48; H01L 23/3107; H01L 23/49503; H01L 23/49555; H01L 23/057; H01L 23/49827; H05K 3/3426; H05K 1/181
USPC .............. 174/528, 529, 531, 533, 552, 551; 361/669, 769, 770, 761, 760; 73/493
See application file for complete search history.

(56) References Cited

U.S. PATENT DOCUMENTS

| | | | | |
|---|---|---|---|---|
| 4,521,828 | A * | 6/1985 | Fanning | 361/715 |
| 4,642,419 | A * | 2/1987 | Meddles | 174/552 |
| 4,725,692 | A * | 2/1988 | Ishii et al. | 174/531 |
| 4,758,063 | A * | 7/1988 | Konechny, Jr. | 385/53 |
| 5,586,008 | A * | 12/1996 | Kozel et al. | 361/743 |
| 5,754,402 | A * | 5/1998 | Matsuzaki et al. | 361/707 |
| 5,790,378 | A * | 8/1998 | Chillara | 361/719 |
| 5,877,937 | A * | 3/1999 | Shibata et al. | 361/719 |
| 5,998,989 | A | 12/1999 | Lohberg | |
| 6,710,373 | B2 * | 3/2004 | Wang | H01L 33/62 257/100 |
| 6,927,482 | B1 * | 8/2005 | Kim et al. | 257/670 |
| 6,948,856 | B2 * | 9/2005 | Takizawa et al. | 384/448 |
| 7,157,312 | B2 * | 1/2007 | Kim et al. | 438/123 |
| 7,287,908 | B2 * | 10/2007 | Niebling et al. | 384/448 |
| 7,429,133 | B2 * | 9/2008 | Gallion et al. | 384/448 |
| 7,568,842 | B2 * | 8/2009 | Gempper et al. | 384/448 |
| 7,591,194 | B2 * | 9/2009 | Pecher et al. | 73/862.322 |
| 7,808,088 | B2 * | 10/2010 | Lange | 257/676 |
| 7,989,931 | B2 * | 8/2011 | Govindaiah et al. | 257/670 |
| 2001/0050422 | A1 | 12/2001 | Kishimoto | |
| 2002/0180424 | A1 | 12/2002 | Aoki | |
| 2003/0075786 | A1 * | 4/2003 | Joshi | H01L 23/495 257/676 |
| 2004/0080308 | A1 | 4/2004 | Goto | |
| 2004/0080314 | A1 | 4/2004 | Tsujii | |
| 2006/0001116 | A1 | 1/2006 | Auburger | |
| 2006/0054901 | A1 | 3/2006 | Shoji | |
| 2007/0075409 | A1 | 4/2007 | Letterman | |
| 2008/0101740 | A1 * | 5/2008 | Aoki et al. | 384/446 |
| 2008/0237818 | A1 | 10/2008 | Engel | |
| 2008/0246128 | A1 * | 10/2008 | Yang | H01L 23/49555 257/666 |
| 2009/0243948 | A1 * | 10/2009 | Schmidt | G01S 7/032 343/753 |
| 2010/0043530 | A1 * | 2/2010 | Elian | B81B 7/0048 73/31.06 |
| 2011/0179889 | A1 | 7/2011 | De Volder | |

FOREIGN PATENT DOCUMENTS

| | | |
|---|---|---|
| DE | 10220761 A1 | 12/2002 |
| DE | 10223946 A1 | 12/2002 |
| DE | 10320145 A1 | 5/2004 |
| DE | 102006030133 A1 | 2/2007 |
| DE | 102008021108 A1 | 11/2009 |
| DE | 102008064047 A1 | 4/2010 |
| EP | 0333374 A2 | 9/1989 |
| EP | 0333374 A3 | 9/1989 |
| EP | 1677090 A1 | 7/2006 |
| WO | WO-9517680 A1 | 6/1995 |
| WO | WO-9943032 A2 | 8/1999 |

OTHER PUBLICATIONS

German Application Serial No. 102010038988.9, German Search Report dated Mar. 18, 2011, 4 pgs.

International Application Serial No. PCT/EP2010/061457, International Search Report mailed Nov. 25, 2010, 19 pgs.

"Application Description AN1011: AM457 Precision Amplifier IC for Strain Gage Elements", Analog Microelectronics, (Apr. 2005), XP-002604859, 4 pgs.

"Linear Integrated Circuits TBA 810S TBA 810AS", 399-410.

* cited by examiner

SENSOR ARRANGEMENT AND CHIP COMPRISING ADDITIONAL FIXING PINS

CROSS REFERENCE TO RELATED APPLICATIONS

This application is the U.S. National Phase Application of PCT International Application No. PCT/EP2010/061457, filed Aug. 5, 2010, which claims priority to German Patent Application No. 10 2009 036 133.2, filed Aug. 5, 2009, the contents of such applications being incorporated by reference herein.

FIELD OF THE INVENTION

The invention relates to an electronic chip, a sensor arrangement, and the use of the electronic chip or of the sensor arrangement in motor vehicles.

BACKGROUND OF THE INVENTION

The invention is based on a chip which can be applied in a relatively robust manner, and also a cost-effective and robust sensor arrangement comprising an interface arrangement. The chip and the sensor arrangement are intended to make possible, in particular, a fixing that is relatively insensitive. Additionally or alternatively, the chip and the sensor arrangement are intended to make possible a fixing that influences other components relatively little.

SUMMARY OF THE INVENTION

This is achieved according to aspects of the invention by means of the electronic chip at least one electronic circuit and two or more contact-making pins, wherein the chip additionally has at least one fixing pin and the sensor arrangement for detecting at least one physical or chemical variable relating to a carrier, such as a variable of the carrier, a variable of an object on the carrier, or a variable of an object in the carrier, wherein the sensor arrangement has at least one sensor element which is arranged directly or indirectly on or in the carrier, and also has an electronic interface arrangement which at least one leadframe, at least one electronic circuit contact-connected to the leadframe, and also at least one electrically insulating housing part which is embodied in such a way that it at least partly encloses the electronic circuit and/or mechanically connects at least parts of the leadframe to one another, wherein the interface arrangement has two or more contact-making pins, at least one of which is electrically conductively connected to the at least one sensor element, wherein the interface arrangement additionally has at least one fixing pin which is directly or indirectly mechanically connected to the carrier.

By virtue of the use of additional fixing pins, the contact-making pins of the chip or of the interface arrangement can be designed to be, in particular, mechanically relatively weak or soft and, therefore, when making contact with a sensor element that measures a mechanical variable on or in a carrier, influence this measurement relatively little or in a manner that is not relevant.

The interface arrangement is preferably embodied as a "premolding" or has a "premold housing" or has insert molding segments which are partially molded with the leadframe.

The carrier is preferably embodied as a bearing housing or bearing shell or torsion bar or bending beam or membrane.

An electronic chip is preferably understood to mean at least one integrated electronic circuit in a housing, wherein the housing has contact-making pins which lead electrical contacts out of the housing.

The sensor arrangement preferably comprises at least one electronic chip as interface arrangement, into which at least one signal processing circuit and/or, in particular, at least one additional sensor element are/is integrated.

It is preferably the case that the at least one fixing pin of the chip or of the interface arrangement has at least one of the following features:

the at least one fixing pin has a larger cross section than the contact-making pins, the at least one fixing pin is formed from a different material than the contact-making pins, the at least one fixing pin is formed in a manner projecting further from the chip than the contact-making pins, or the spring stiffness of the at least one fixing pin is at least 25% greater than, in particular at least twice as great as, the spring stiffness of a contact-making pin. Preferably, the chip has three or four or more fixing pins, in particular 6 or 8, in order to enable particularly solid and insensitive fixing of the chip.

The fixing pins of the chip are preferably formed and arranged in such a way that they project from the chip to different extents in comparison with the contact-making pins.

The at least one fixing pin preferably projects more than half or more than double or more than triple the height or length or width of the chip housing laterally. As a result, the contact-making in the direct vicinity of the chip is facilitated because the fixing pins do not disturb other components in the direct vicinity of the chip. Such disturbance relates to undesirable mechanical and/or electromagnetic influencing of components.

The contact-making pins and the fixing pins of the chip and/or of the interface arrangement are expediently formed from metal.

The contact-making pins and the fixing pins of the chip and/or of the interface arrangement are preferably formed in each case as part, in particular an integral part, of a leadframe, in particular as part of the leadframe of the interface arrangement.

The fixing pins of the chip and of the interface arrangement are preferably formed and connected in such a way that they conduct or transmit substantially no electrical signals.

The sensor arrangement preferably in this case, has a plurality of sensor elements which are arranged directly or indirectly on or in the carrier and in each case have a defined measurement zone with the carrier, wherein the interface arrangement comprises a plurality of fixing pins which are in each case mechanically directly or indirectly connected to the carrier, in each case outside the measurement zones of the sensor elements. The measurement zone of a sensor element is defined, in particular, as the contact area between the sensor element and the carrier and additionally the adjoining area of the carrier around the contact area with a width of said adjoining area which is greater than or equal to 50% of the width or of the length of the basic area of the sensor element, in particular with a width of the additional adjoining area being greater than or equal to the whole width or length of the basic area of the sensor element, particularly preferably with a width of the additional adjoining area greater than or equal to three times the width or length of the basic area of the sensor element.

The interface arrangement is preferably arranged above one or more of the sensor elements.

The interface arrangement preferably encloses the carrier and in particular additionally encloses jointly with the carrier the sensor elements arranged thereon/therein. In this case, the interface arrangement is correspondingly formed and arranged, particularly preferably in a substantially ring-shaped manner.

The interface arrangement of the sensor arrangement is preferably embodied as a chip, wherein the fixing pins and contact-making pins thereof are connected to an electrically insulating housing enclosing the at least one electronic circuit, and/or the leadframe.

The one or the plurality of sensor elements are preferably embodied in such a way that they detect a mechanical variable of the carrier.

The at least one sensor element is preferably embodied as a strain gauge and, in particular, connected to the carrier by an electrically insulating insulation layer.

The sensor element is alternatively preferably embodied as based on one or more of the following operating principles: capacitative, resistive, inductive, piezoelectric, piezoresistive, optical, chemosensitive, and magnetoresistive.

In this case, the sensor element is embodied, in particular, in such a way that it can detect one or more of the following variables: pressure, force, torsion, temperature, bending, structure-borne sound, chemical variables, electromagnetic variables, and optical variables. In this case, the sensor arrangement is embodied, in particular, in such a way that the at least one sensor element detects or taps off said variable(s) from the carrier.

It is preferably the case that the sensor element is connected to the carrier by one or more of the following layers: an adhesive layer, a soldering layer, a thick-film layer, a thin-film layer, a sputtering layer, and a vapor deposition layer.

The chip housing or the housing around the interface arrangement is preferably formed from plastic or mold.

The chip preferably comprises an integrated signal processing circuit, in particular a sensor signal processing circuit, and an additional integrated self-test circuit, both of which are surrounded by the chip housing.

The chip and the sensor element on the carrier are preferably both jointly and in this case respectively at least partly surrounded or covered by a protective compound, or at least partly surrounded or covered by a cover.

The at least one sensor element and the interface arrangement are covered or surrounded jointly on the carrier at least partly by a protective compound, or are covered or surrounded jointly on the carrier at least partly by at least one cover or housing.

A protective compound is preferably understood to one or more of the following materials: sealing gel, in particular silicone, protective gel, thermoplastic, thermosetting plastic, and foam.

A cover is preferably understood to mean a housing or housing part.

The cover is preferably formed from metal.

In particular, the cover is a substantially solid outer cover. The cover is alternatively preferably an inner cover, for example for insert molding and for stiffening, which is formed with openings for example in perforated or punctured or grid-shaped form. The inner cover with openings is at least partly surrounded by an outer cover composed of plastic. In this case, the plastic material of said outer cover is formed, in particular, in such a way that it projects into the inner cover, even particularly preferably substantially fills the latter.

The at least one cover, in particular the single cover, is filled with a protective compound. Additionally or alternatively, the inner cover or the outer cover are preferably additionally fixed to the carrier with substantially L-shaped housing fixing elements in order to increase the robustness of the corresponding cover fitting. This at least one housing fixing element can also be part of the housing itself.

The carrier is preferably embodied in curved fashion, in particular as an outer housing of a bearing.

The leadframe is preferably formed from metal or from metal strands or metal conductors and alternatively preferably from metal tracks on a film and/or on a plastic carrier.

The sensor arrangement expediently comprises a self-test device, which is embodied in such a way that it tests the electrical effectiveness of the insulation layer between sensor element and carrier and/or the electrical effectiveness of an additional insulation layer between the at least one electronic circuit of the interface arrangement and the at least one sensor element. In this case, the self-test device comprises, in particular, an electronic test circuit, which detects an electrical variable, particularly preferably the current, through the carrier, via at least one fixing pin electrically connected to the test circuit directly or indirectly via a bonding connection, and the at least one sensor element, through at least one contact-making pin connected to the test circuit directly or indirectly via a bonding connection.

It is preferably the case that the interface arrangement at least partly encloses jointly the carrier and the sensor elements arranged on/in the latter, wherein the interface arrangement and also the sensor elements are additionally jointly surrounded by an inner housing having openings, which is fixed on the carrier and the interface arrangement, the sensor elements and also the inner housing are jointly encapsulated by injection molding with plastic as outer housing on the carrier.

Alternatively preferably, the interface arrangement at least partly encloses jointly the carrier and the sensor elements arranged on/in the latter, wherein the interface arrangement and also the sensor elements are additionally jointly surrounded by a substantially solid housing, in particular composed of metal, fixed on the carrier, said housing being filled with a protective compound.

Preferably, the sensor arrangement is embodied in such a way that the sensor element is electrically non-conductively fixed on the carrier and the chip is arranged substantially thereabove, wherein the fixing pins of said chip are arranged in an outer region of the sensor element, in a manner fixed to the carrier, and its contact-making pins are connected to contact locations of the sensor element. The sensor element and the chip are at least partly, in particular completely, covered by a protective compound. Arranged thereabove is, in particular, an inner cover, which is likewise fixed on the carrier, further out than the contact-making pins. Said inner cover is particularly preferably embodied in perforated or grid-shaped fashion. Especially preferably, an outer cover composed of plastic is arranged thereabove, wherein the plastic extends into the inner cover through the openings thereof and optionally substantially encloses the inner cover.

Alternatively preferably, the sensor arrangement has no inner cover above the protective compound and instead has a substantially impermeable, in particular hermetically sealed, cover composed of metal or plastic, which is connected to the carrier and protects the sensor element and the chip.

It is expedient for the sensor element and the chip to be connected to one another with an adhesive location and/or a damping element.

The carrier is preferably embodied in curved fashion. In particular, the carrier is the outer housing of a bearing, particularly preferably wheel bearing of a motor vehicle. The carrier is alternatively preferably the outer casing of a torsion bar.

It is preferably the case that the at least one sensor element is arranged on a fixing layer, which, in particular, is embodied in electrically insulating fashion, on the carrier.

Preferably, length l by which the at least one fixing pin projects laterally from the chip housing, that is to say, in particular, substantially the length along perpendicularly to the normal to the surface of the carrier, particularly preferably centrally below the sensor element, from the outer casing of the chip housing as far as the end of the fixing pin in this direction, is longer or greater than $1/10$ or $1/4$ or 1 times the thickness of the fixing layer between sensor element and carrier or greater than $1/10$ or $1/4$ or 1 times the thickness of the sensor element or greater than $1/10$ or $1/4$ or 1 times the thickness of the carrier, for example the wall thickness of the wheel bearing housing.

The sensor arrangement preferably comprises a cable outgoer, which makes electrical contact with the interface arrangement or the chip. In this case, the cable outgoer is incorporated, in particular, into the at least one housing of the sensor arrangement. The cable outgoer is embodied in such a way that the contact-connection between interface arrangement and cable outgoer has a relatively high flexural fatigue strength, for example by virtue of the material of said contact-connection, which is particularly preferably effected via a leadframe conductor which has an elastic zone and is optionally formed from a different material than the contact-making pins and/or fixing pins.

The interface arrangement constitutes, in particular, the signal matching between the one or the plurality of sensor elements and electrical connection. In this case, the interface arrangement expediently comprises the signal amplification, filtering, calibration, output driver stage, power supply and self-monitoring or parts thereof. Embodiments comprising additional sensor elements with evaluation electronics (e.g. acceleration sensors) can also be realized. Further information can be obtained by jointly evaluating the sensor signals.

In this case with regard to one or a plurality of sensor elements, the sensor arrangement comprises one or a respective distributor element which is arranged on an electrical contact of a sensor element and in this case, in particular, is embodied and arranged in such a way that said distributor element has a substantially planar surface, even if the electrical contact or the electrical contract pad of the sensor element has a slightly curved surface. This improves the pressure distribution during the mechanical contact-connection and production of a planar contact-making area in the case of curved sensor areas.

It is preferably the case that one or more of the electrical contacts of the contact-making elements, other electrical contacts, the sensor element, and at least parts of the interface arrangement are at least partly are covered with protective compound, in the for mechanical and thermal load relief during insert molding. This is particularly preferably also provided if a sensor arrangement has an inner housing having openings and also an outer housing composed of mold or plastic injection-molded material.

The interface arrangement is expediently additionally adhesively bonded onto the carrier, for example by means of an adhesive or a film. The aim of said adhesive is to attach an additional fixing, a protective layer, mechanical damping layer or an acoustic linking.

The inner housing having openings is expediently mechanically connected to the cable outgoer for strain relief and, in particular, at least partly insert-molded jointly with the cable outgoer.

In the field of sensor technology and actuator technology there is, for example, often the objective of fitting drive or evaluation electronics in direct proximity to the sensor element or actuator element. If the sensor element is connected to the construction element in a force-locking manner, then there is the difficulty of realizing a suitable connection and mounting technique for the electronics.

Direct mounting of bare dies on the construction element and connection of the element to the bare die by means of wire bonding technology can cause the following disadvantages, for example:

high risk of contamination of the contact surfaces by the production environment in the non-clean room risk of damage to the bare die as a result of handling in the unprotected state increased capital expenditure as a result of special constructions required in respect of apparatus the direct mounting of the bare die leads to mechanical stresses being coupled into the chip and, consequently, to a change in the properties of the chip. The piezoresistive structures on the chip are crucial.

Furthermore, the temperature of the carrier/measurement interface is coupled in directly to the chip. Intensified ageing of the bonding connection and an increased temperature drift occur as a result.

These difficulties are resolved, in particular, by means of the chip and also the sensor arrangement.

The integrated sensor signal processing circuit is preferably decoupled completely from the mechanical stresses on the carrier/measurement interface in the molded interface IC. The absolute and also average operating temperature is preferably significantly decreased by the spatial decoupling. The expedient additional protection by the molded housing protects the bare die against chemical attacks that can adversely influence the lifetime and behavior of the IC.

The invention additionally relates to the use of the sensor arrangement on the outer housing of a bearing, in particular of a wheel bearing, in a motor vehicle.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
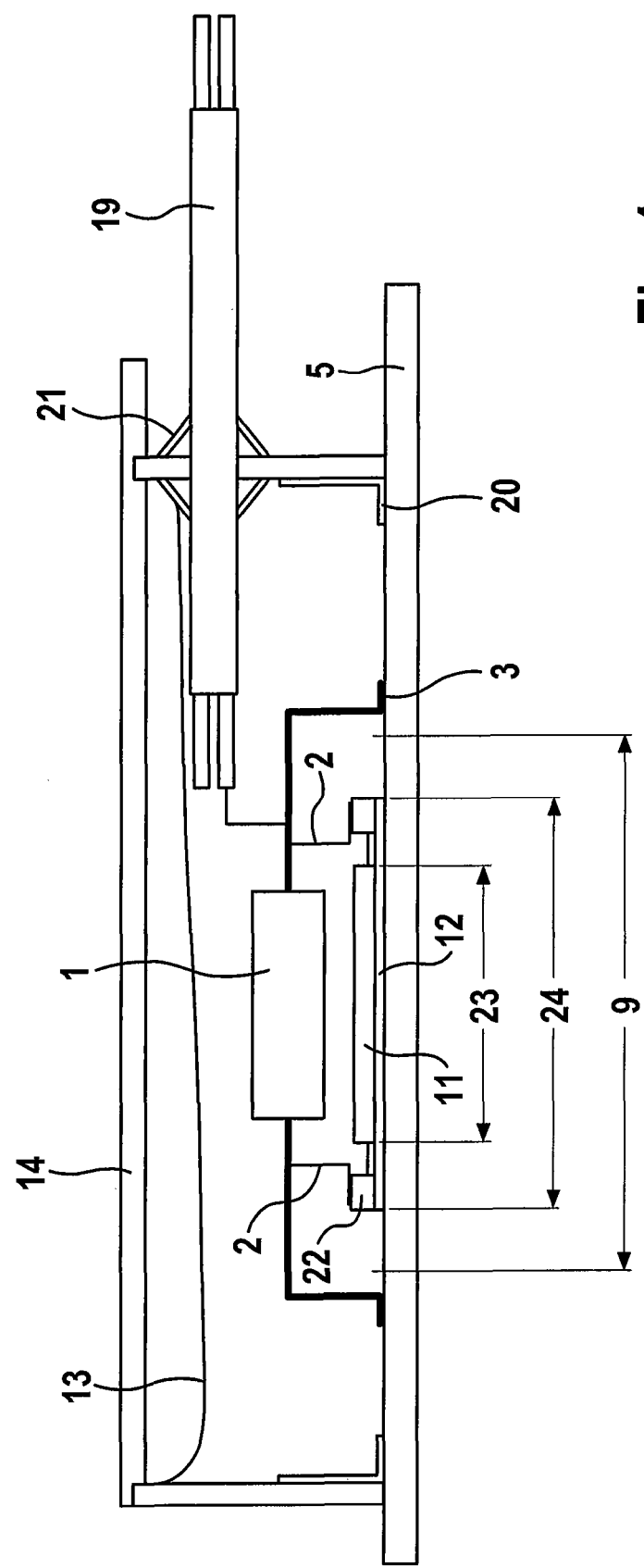
FIG. 1 shows an exemplary embodiment of a sensor arrangement with a single sensor element and an interface arrangement which has a chip.

FIG. 1 illustrates an exemplary sensor arrangement, comprising a sensor element 11, which is fixed by means of an insulation layer 12 on carrier 5. The electrical contacts of the sensor element 11 have distributor elements 22 in order to mechanically compensate for a slight curvature (not illustrated) of the carrier 5 and of the contact-making pads of the sensor element 11. Chip 1, which comprises an electronic circuit, an electronic signal processing circuit in accordance with the example, is part of the interface arrangement and is arranged above the sensor element 11. In this case, chip 1 is fixed to carrier 5 by means of fixing pins 3, outside the measurement zone 9, which, in accordance with the example, goes beyond the contact area 24 between sensor element 11 and carrier 5 and frames the basic area 23 of the sensor element in an enclosing fashion with half a length of said basic area. The electrical contact-connection between chip 1 and sensor element 11 is effected via contact-making pins 2. The sensor arrangement comprises a cable outgoer 19, which is electrically conductively connected to chip 1 and is mechanically connected to housing 14 composed of metal, wherein, for this purpose, additional fixing elements 21 ensure mechanical strain relief of the cable outgoer 19. Housing 14 is filled with a protective compound 13, an electrically insulating gel in accordance with the example, and has housing fixing elements 20 for particularly robust fixing to carrier 5.

Figure 2:
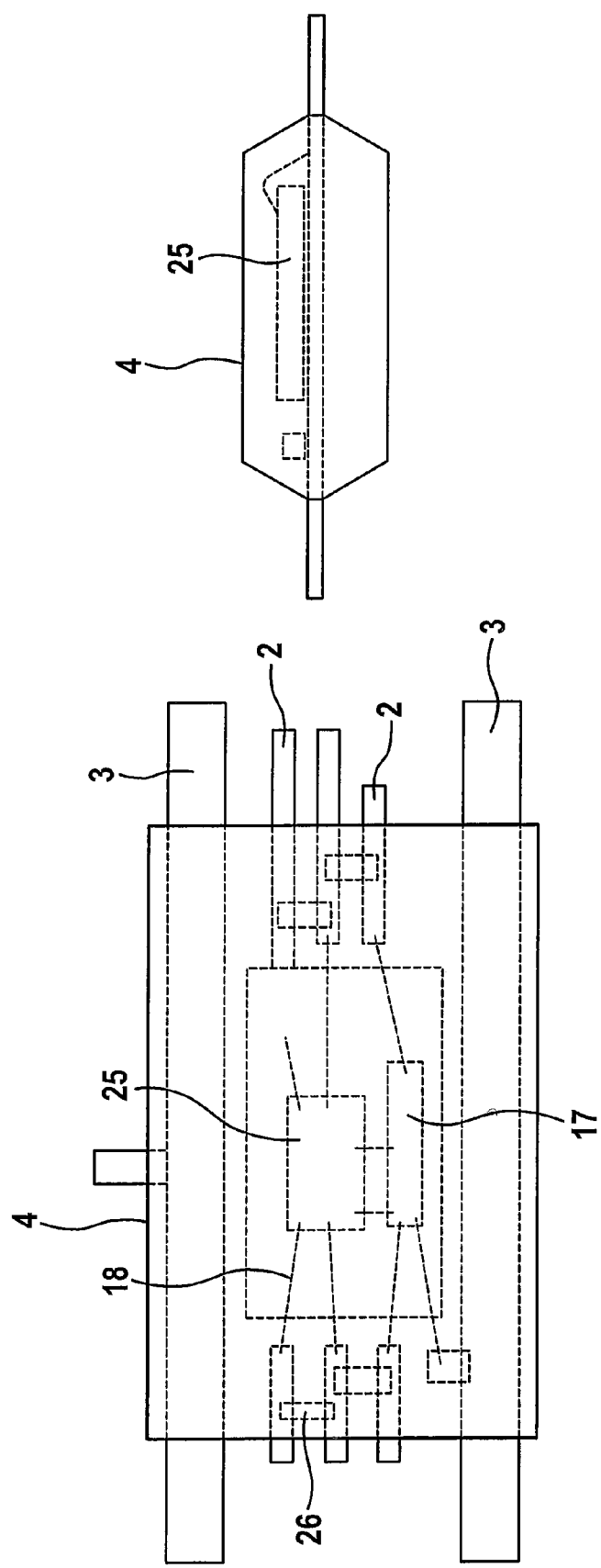
FIG. 2 shows an exemplary chip.

FIG. 2 shows an exemplary chip comprising an electronic circuit 25 and also a self-test circuit 17, which are in each case connected via bonding connections 18 to contact-making pins 2. The self-test circuit 17 is additionally connected to a fixing pin 3 in order to test and monitor the electrical insulation of the contact-making pins 2 and of the circuit 25 with respect to the carrier (not illustrated) to which fixing pins 3 are fixed. Chip 1 has a housing 4 composed of plastic. In accordance with the example, the contact-making pins 2 are connected to one another in pairs by means of protective capacitors 26, in order to increase the electromagnetic compatibility of the arrangement.

Figure 3:
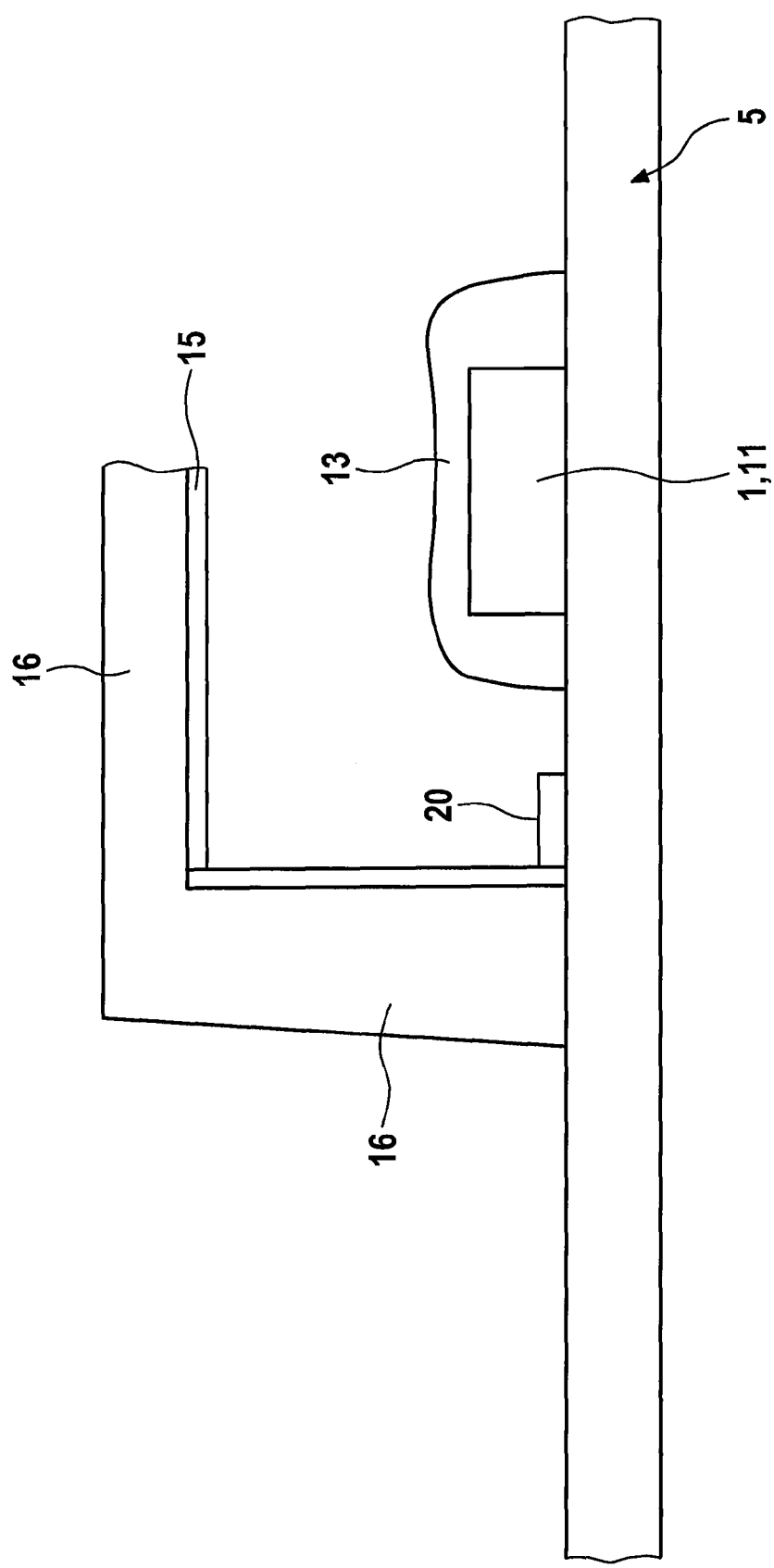
FIG. 3 shows the exemplary encapsulation of an interface arrangement and of a sensor element with an inner housing and an outer housing composed of plastic injection-molded material.

In FIG. 3, a chip 1 is surrounded jointly with a sensor element 11 as a "blackbox" by a protective compound 13 on carrier 5. An inner housing 15 having openings (not illustrated) is surrounded by an outer housing 16 composed of mold or injection-molded plastic. Inner housing 15 is fixed to carrier 5 particularly solidly by housing fixing elements 20.

Figure 4:
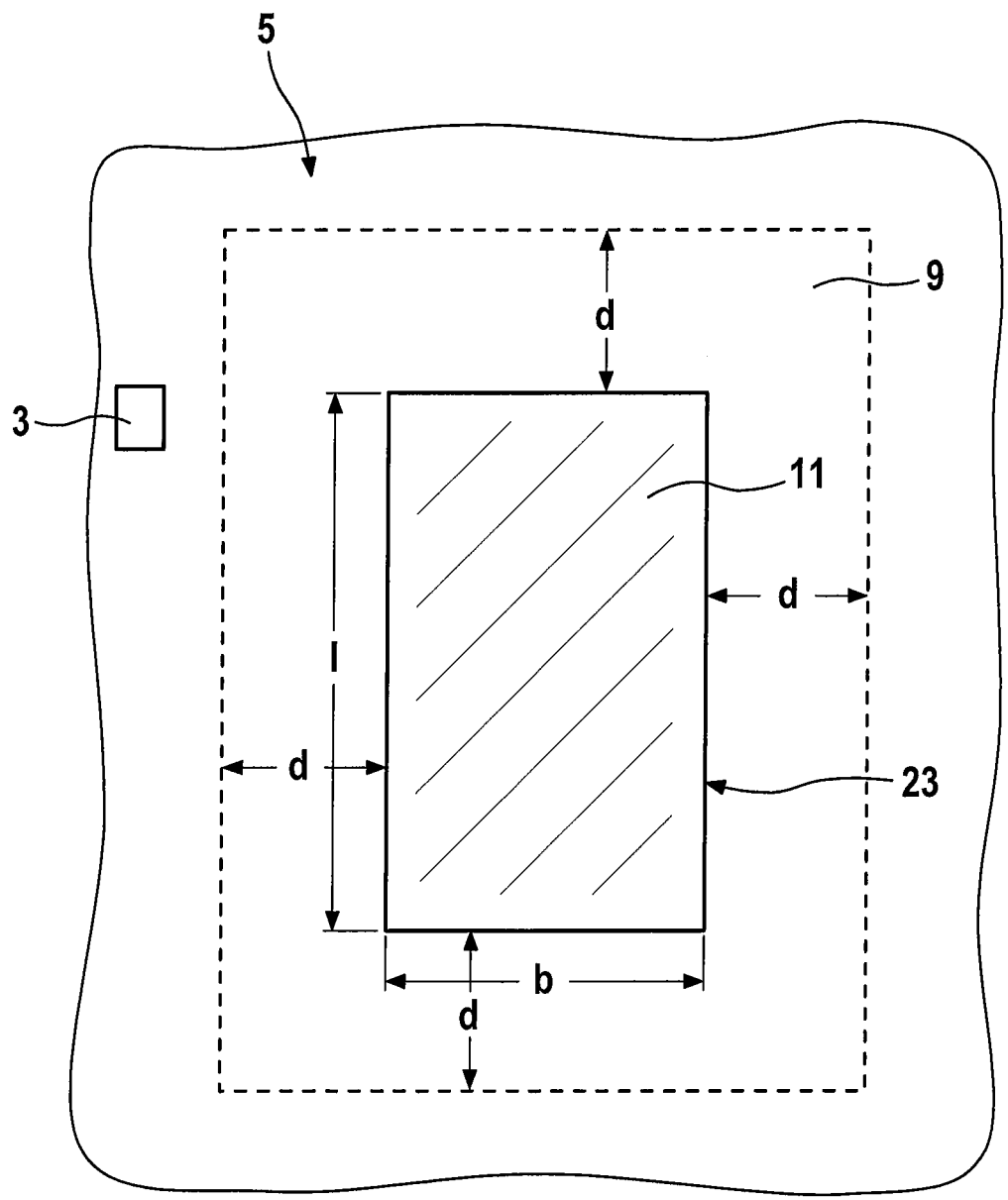
FIG. 4 shows an exemplary illustration of a measurement zone of a sensor element on the carrier.

The sensor element 11 illustrated by way of example in FIG. 4 is applied to carrier 5 and in this case has a basic area 23 having the length l and the width b. In accordance with the example, the measurement zone 9 extends with a width d around said basic area in a framing fashion, wherein this width b of the measurement zone around and the basic area 23 of the sensor element 11 corresponds to half of the width b of the basic area 23 of the sensor element. Outside this measurement zone 9, fixing pin 3 is fixed to carrier 5.

Figure 5:
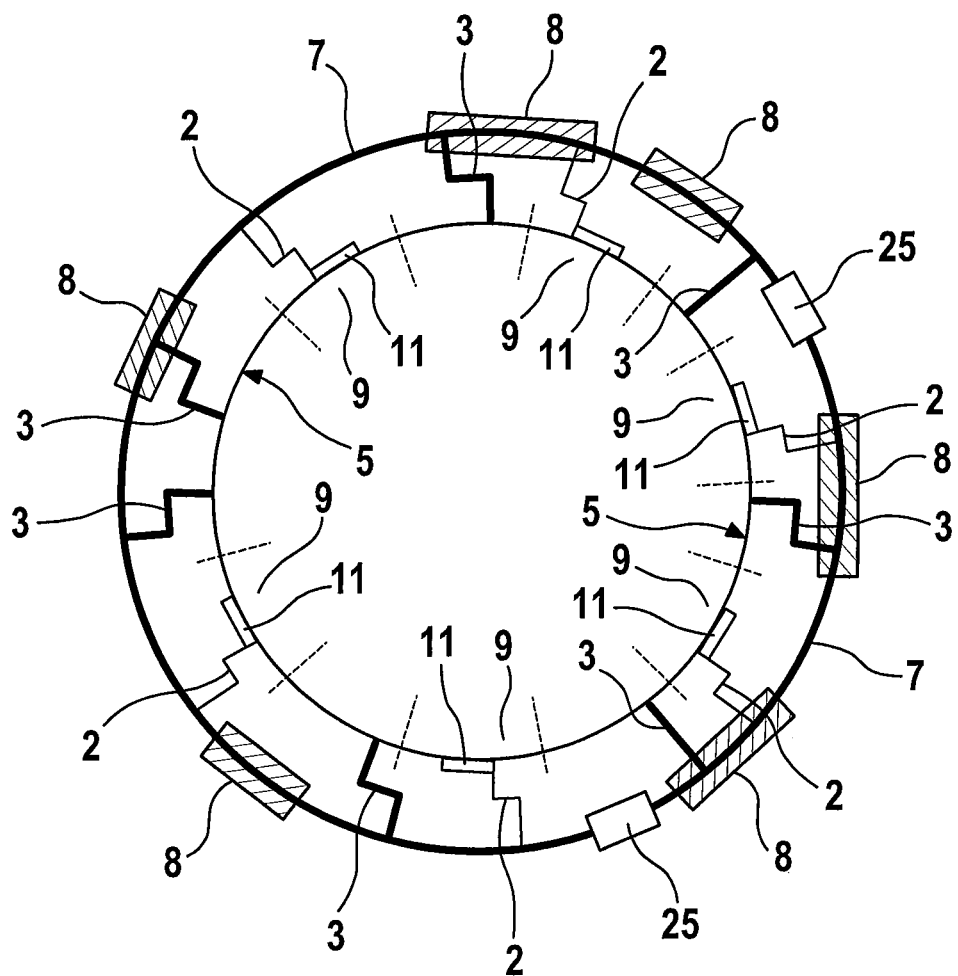
FIG. 5 shows a sensor arrangement in which the interface arrangement encloses the carrier.

FIG. 5 shows an exemplary sensor arrangement with an interface arrangement reaching around carrier 5 in a ring-shaped manner. In this case, the interface arrangement comprises electronic circuits 25, leadframe 7, plastic parts 8 composed of "premold" or "mold" as electrically insulating housing parts, which mechanically fix the interconnects of the leadframe 7, and also contact-making pins 2, which are connected to the sensor elements 11 arranged on the carrier 5 and fixing pins 3, by which the interface arrangement or the leadframe 7 is mechanically fixed to carrier 5, although in each case outside the measurement zones 9 of the sensor elements 11.

Figure 6:
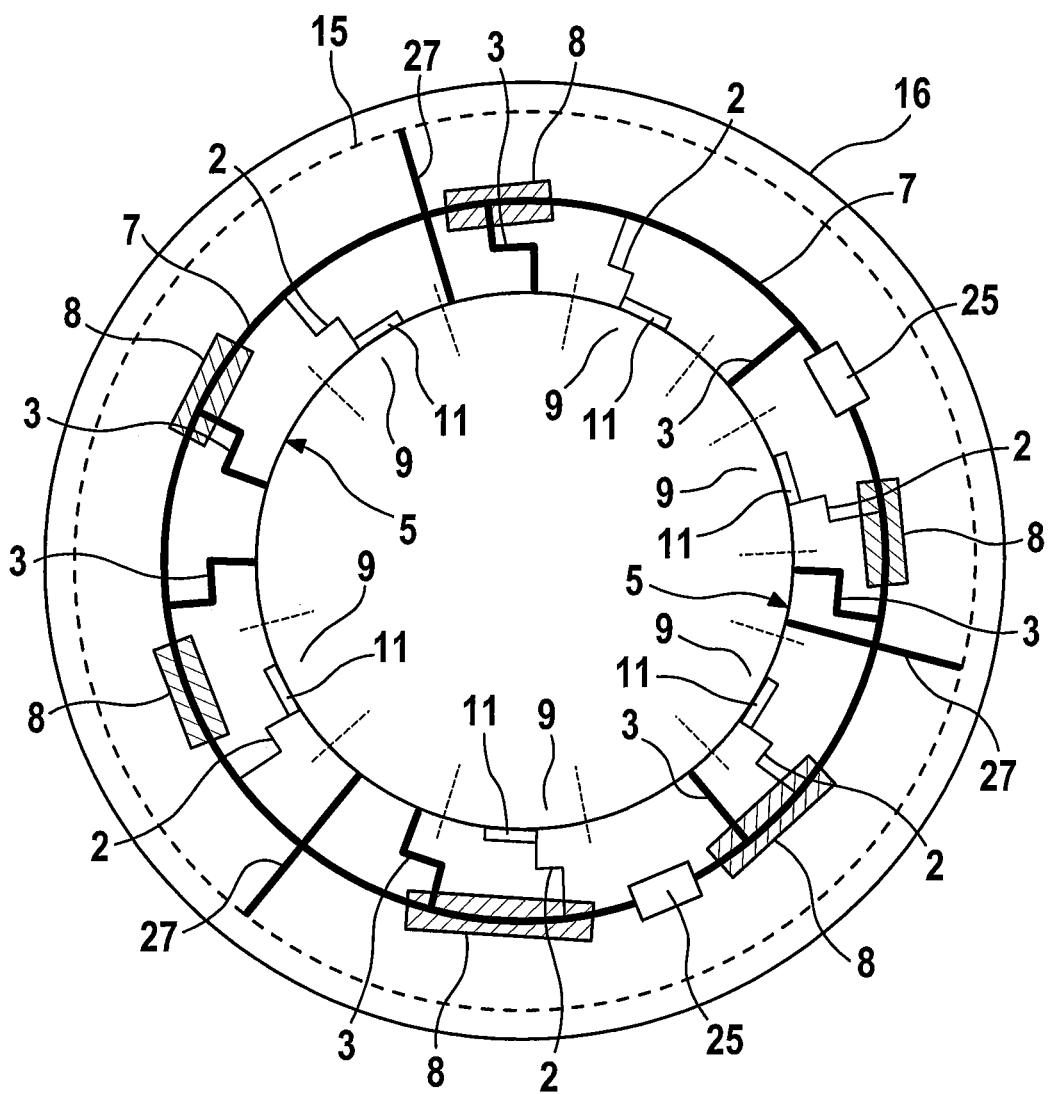
FIG. 6 shows a ring-shaped exemplary embodiment of an interface arrangement within a sensor arrangement, enclosed by an inner housing and an outer housing composed of plastic injection-molded material.

FIG. 6 shows an exemplary embodiment of a sensor arrangement which, in addition to the example shown in FIG. 5, has an inner housing 15 having openings (not illustrated) which is fixed to carrier 5 by means of fixings 27 in each case outside the measurement zones 9 of the sensor elements 11. In this case, inner housing 15 is enclosed by outer housing 16 composed of injection-molded plastic.

Figure 7:
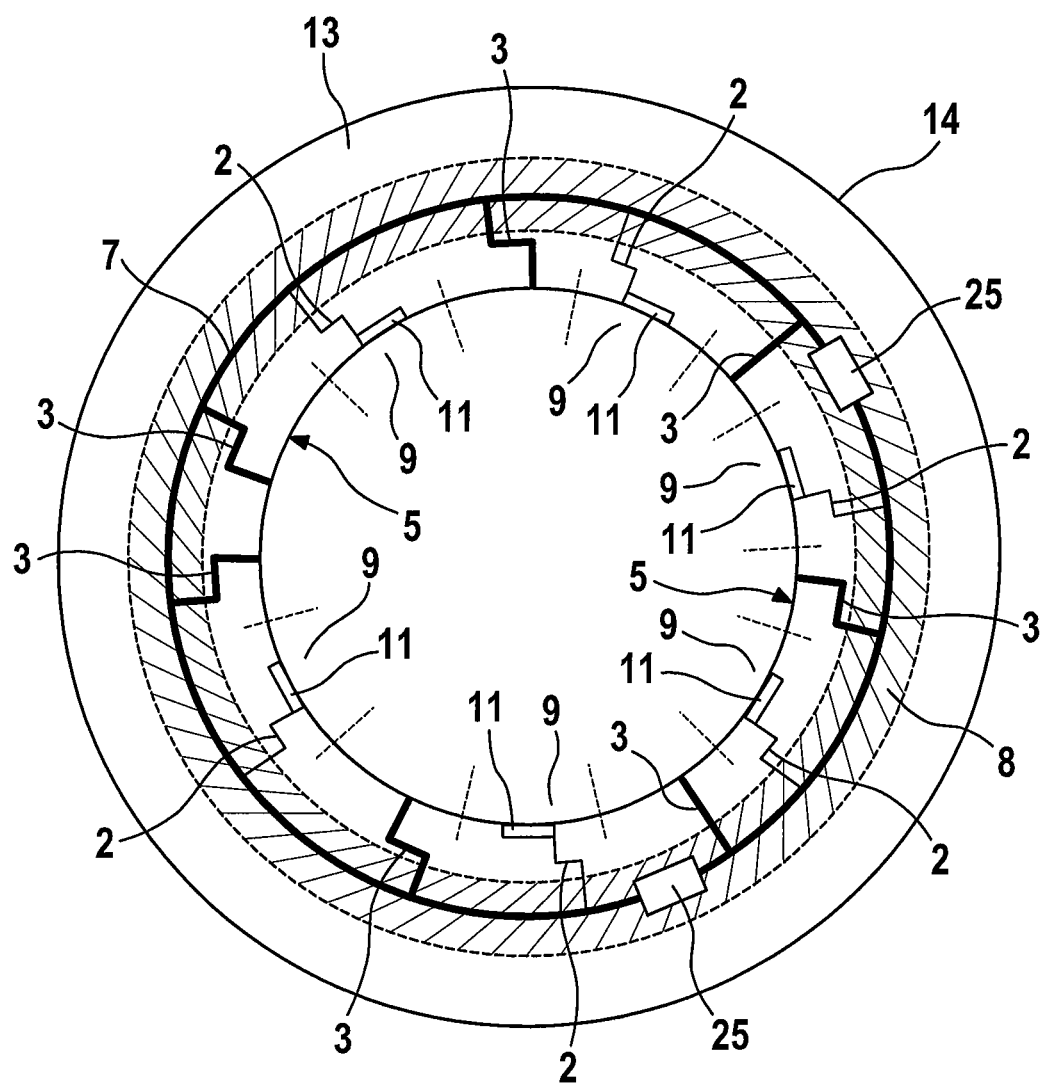
FIG. 7 shows an exemplary embodiment of a sensor arrangement in which the interface arrangement is substantially surrounded by an injection-molded housing as an electrically insulating housing part and said interface arrangement is surrounded in its entirety by a solid housing composed of metal, filled with a protective compound.

FIG. 7 shows an exemplary sensor arrangement in which the interface arrangement likewise reaches around the carrier 5 and is likewise arranged above sensor elements 11 fixed on the carrier. The interface arrangement comprises electronic circuits 25, leadframe 7, contact-making pins 2, which are connected to sensor elements 11, and also fixing pins 3, which are mechanically connected to the carrier 5 in each case outside the measurement zones 9 of the sensor elements 11. Leadframe 7 and also the circuits 25 are at least partly embedded into a ring-shaped plastic housing 8, illustrated in a hatched fashion. The entire interface arrangement and the sensor elements are surrounded by housing 14 filled with a protective compound 13.

Figure 8:
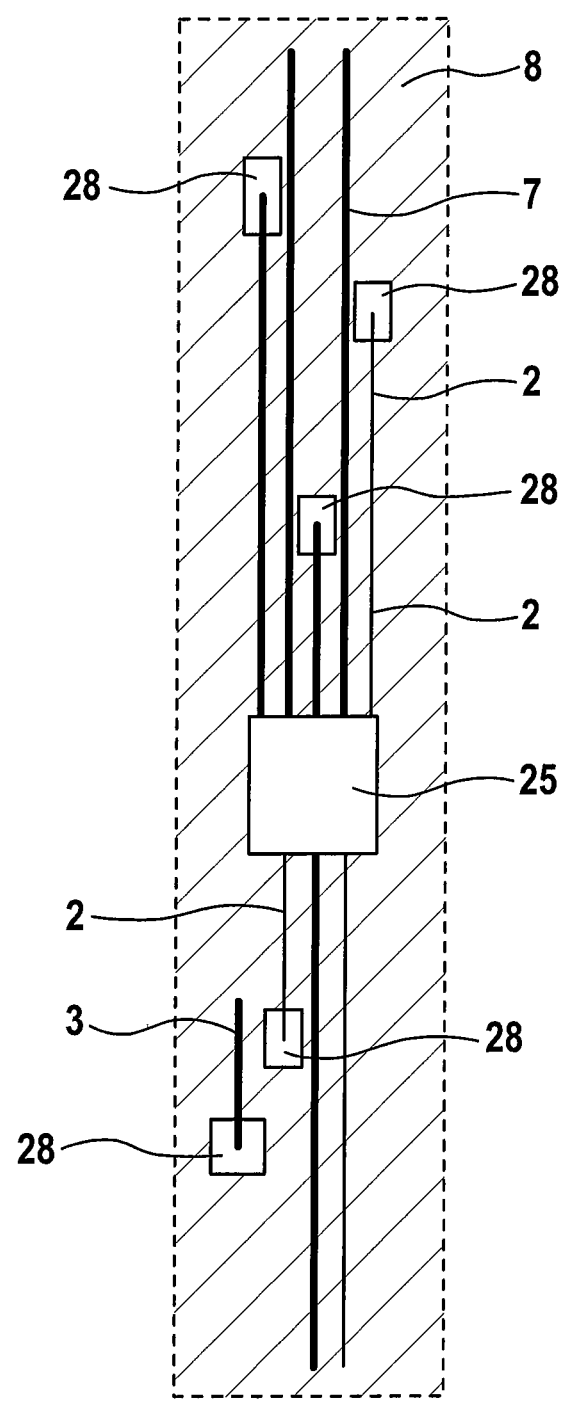
FIG. 8 shows the exemplary interface arrangement from FIG. 7 from above, wherein cutouts in the injection-molded housing are shown, with the aid of which the contact-making pins and fixing pins can be welded externally to the carrier or the sensor element.

FIG. 8 shows a segment of the exemplary ring-shaped plastic housing 8 "premold" from FIG. 7, into which the electronic circuit 25 and also large parts of the leadframe 7 are embedded, from above. The interconnects of the leadframe 7 are fixed by said housing 8. In the region of the contact-making pins 2 and fixing pins 3 which are integrally connected in part to the leadframe, the housing 8 has cutouts 28 in the mold, through which the respective contact-connection and fixing of said pins can be led, for example by means of a welding process from above, before the outer housing or generally a common housing of the sensor arrangement is installed.

The invention claimed is:

1. An electronic chip, comprising at least one electronic circuit, two or more contact-making pins, and at least one fixing pin, wherein the at least one fixing pin includes a first portion that projects in a lateral direction from the chip, and includes a second portion that projects in a direction perpendicular to the lateral direction below a lower surface of the chip, the second portion projecting further below the lower surface of the chip than each of the contact-making pins, wherein the at least one fixing pin extends from a same side of the chip as the two or more contact-making pins, and wherein the at least one fixing pin has at least one feature selected from a group consisting of:

the at least one fixing pin has a larger cross section than the contact-making pins, the at least one fixing pin is formed from a different material than the contact-making pins, and the spring stiffness of the at least one fixing pin is at least 25% greater than the spring stiffness of the contact-making pin.

2. The chip as claimed in claim 1, wherein the spring stiffness of the at least one fixing pin is at least twice as great as the spring stiffness of the contact-making pin.

3. An electronic chip, comprising at least one electronic circuit, two or more contact-making pins, and at least one fixing pin,
wherein the at least one fixing pin includes a first portion that projects in a lateral direction from the chip, and includes a second portion that projects in a direction perpendicular to the lateral direction below a lower surface of the chip, the second portion projecting further below the lower surface of the chip than each of the contact-making pins,
wherein the at least one fixing pin extends from a same side of the chip as the two or more contact-making pins, and
wherein the at least one fixing pin projects more than half the height or length or width of the chip housing laterally from the chip housing.

4. A sensor arrangement for detecting at least one physical or chemical variable relating to a carrier, wherein the sensor arrangement has at least one sensor element which is directly or Indirectly coupled to the carrier, and also has an electronic interface arrangement with at least one leadframe, at least one electronic circuit connected to the at least one leadframe, and also at least one electrically insulating housing part which is embodied in such a way that it performs at least one of the functions of (i) at least partly enclosing the at least one electronic circuit, and (ii) mechanically supporting at least parts of the at least one leadframe to one another, wherein the electronic interface arrangement has two or more contact-making pins, at least one of which is electrically conductively connected to the at least one sensor element,
wherein the electronic interface arrangement additionally has at least one fixing pin which is directly or indirectly mechanically connected to the carrier, the at least one fixing pin including a first portion that projects in a lateral direction from the electronic interface arrangement, and a second portion that projects in a direction perpendicular to the lateral direction below a lower surface of the electronic interface arrangement,
wherein the at least one sensor element has a defined measurement zone with the carrier, the defined measurement zone defined as a contact area between the at least one sensor element and the carrier and a predetermined area of the carrier surrounding the contact area, and
wherein the at least one fixing pin is directly or indirectly mechanically connected to the carrier in an area of the carrier outside the defined measurement zone of the at least one sensor element.

5. The sensor arrangement as claimed in claim 4, wherein the sensor arrangement has a plurality of sensor elements which are arranged directly or indirectly on or in the carrier and wherein the interface arrangement comprises a plurality of fixing pins.

6. The sensor arrangement as claimed in claim 5, wherein the measurement zone of each sensor element is defined as the contact area between the sensor element and the carrier and additionally an adjoining area of the carrier around the contact area with a width (d) of said adjoining area which is greater than or equal to 50% of a width (b) or of a length (l) of a basic area of the sensor element.

7. The sensor arrangement as claimed in claim 4, wherein the interface arrangement is arranged above one or more of the sensor elements.

8. The sensor arrangement as claimed in claim 4, wherein the interface arrangement is formed and arranged in a manner enclosing the carrier.

9. The sensor arrangement as claimed in claim 4, wherein the interface arrangement is formed and arranged enclosing the carrier in a substantially ring-shaped manner.

10. The sensor arrangement as claimed in claim 4, wherein the at least one fixing pin has at least one feature selected from a group consisting of:
the at least one fixing pin has a larger cross section than the contact-making pins,
the at least one fixing pin is formed from a different material than the contact-making pins, and
the spring stiffness of the at least one fixing pin is at least 25% greater than the spring stiffness of the contact-making pin.

11. The sensor arrangement as claimed in claim 10, wherein the spring stiffness of the at least one fixing pin is at least twice as great as the spring stiffness of the contact-making pin.

12. The sensor arrangement as claimed in claim 4, wherein the sensor element is embodied as a strain gauge and is connected to the carrier by an electrically insulating insulation layer.

13. The sensor arrangement as claimed in claim 4, wherein the at least one sensor element and the interface arrangement are covered or surrounded jointly on the carrier at least partly by at least one of a protective compound, a cover, or a housing.

14. The sensor arrangement as claimed in claim 4, wherein the carrier is embodied in curved fashion as an outer housing of a bearing.

15. The sensor arrangement as claimed in claim 4, wherein the sensor arrangement comprises a self-test device, which is embodied in such a way that it tests one or both of (i) the electrical effectiveness of the insulation layer between sensor element and carrier, and (ii) the electrical effectiveness of an additional insulation layer between the at least one electronic circuit of the Interface arrangement and the at least one sensor element.

16. The sensor arrangement as claimed in claim 4, wherein the Interface arrangement at least partly encloses jointly the carrier and the sensor elements arranged on/in the latter, wherein the interface arrangement and also the sensor elements are additionally jointly surrounded by an Inner housing having openings, which is fixed on the carrier and the interface arrangement, the sensor elements and also the inner housing are jointly encapsulated by injection molding with plastic as outer housing on the carrier.

17. The sensor arrangement as claimed in claim 4, wherein the interface arrangement at least partly encloses jointly the carrier and the sensor elements arranged on/in the latter, wherein the interface arrangement and also the sensor elements are additionally jointly surrounded by a substantially solid housing fixed on the carrier, said housing being filled with a protective compound.

18. An electronic chip, comprising at least one electronic circuit, two or more contact-making pins, and at least one fixing pin,
wherein the at least one fixing pin includes a first portion that projects in a lateral direction from the chip, and includes a second portion that projects in a direction perpendicular to the lateral direction below a lower surface of the chip, the second portion projecting further below the lower surface of the chip than each of the contact-making pins, wherein the at least one fixing pin extends from a same side of the chip as the two or more contact-making pins, and wherein the first portion of the at least one fixing pin projects further from the chip than each of the contact-making pins in the lateral direction.

* * * * *